United States Patent
Cho et al.

(10) Patent No.: US 10,235,312 B2
(45) Date of Patent: Mar. 19, 2019

(54) MEMORY SYSTEM AND HOST DEVICE THAT MAINTAIN COMPATIBILITY WITH MEMORY DEVICES UNDER PREVIOUS STANDARDS AND/OR VERSIONS OF STANDARDS

(71) Applicant: SAMSUNG ELECTRONICS CO., LTD., Suwon-si, Gyeonggi-Do (KR)

(72) Inventors: Hee-Chang Cho, Seoul (KR); Jae-Phil Kong, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/695,072

(22) Filed: Sep. 5, 2017

(65) Prior Publication Data
US 2018/0101492 A1  Apr. 12, 2018

Related U.S. Application Data

(60) Provisional application No. 62/405,277, filed on Oct. 7, 2016.

(30) Foreign Application Priority Data

Nov. 15, 2016 (KR) .................. 10-2016-0151620

(51) Int. Cl.
*G06F 1/26* (2006.01)
*G11C 5/14* (2006.01)
(Continued)

(52) U.S. Cl.
CPC .............. *G06F 13/385* (2013.01); *G06F 1/26* (2013.01); *G06F 13/4022* (2013.01); *G11C 5/14* (2013.01); *G06F 2213/0042* (2013.01)

(58) Field of Classification Search
CPC ... G06F 1/18; G06F 1/189; G06F 1/26; G06F 1/266; G06F 1/3206; G06F 1/3225;
(Continued)

(56) References Cited

U.S. PATENT DOCUMENTS 6,516,381 B1 * 2/2003 Hamilton ............ G06F 13/4072
  711/105
6,948,016 B2   9/2005 Cedar et al.
(Continued)

OTHER PUBLICATIONS

"Embedded MultiMediaCard(e•MMC) e•MMC/Card Product Standard, High Capacity, including Reliable Write, Boot, Sleep Modes, Dual Data Rate, Multiple Partitions Supports, Security Enhancement, Background Operation and High Priority Interrupt (MMCA, 4.41)". JEDEC Standard JES84-A441. Mar. 2010. (Year: 2010).*
(Continued)

*Primary Examiner* — Thomas J Cleary
(74) *Attorney, Agent, or Firm* — Volentine, Whitt & Francos, PLLC (57) ABSTRACT

A memory system includes a storage device and a host device. The storage device includes a memory device and a device controller. The device controller is configured to store device information. The device information includes a level of a power supply voltage required for the memory device. The host device includes a host controller and a power management integrated circuit (PMIC). The host device is configured to send a query command to receive the device information from the device controller during a power setting period. The PMIC is configured to supply a first level of power supply voltage to the memory device during the power setting period and, after the power setting period, selectively supply one of the first level of power supply voltage and a second level of power supply voltage to the memory device. The first level of power supply voltage is lower than the second level of power supply voltage.

20 Claims, 6 Drawing Sheets

(51) Int. Cl.
*G06F 13/38* (2006.01)
*G06F 13/40* (2006.01)

(58) Field of Classification Search
CPC .... G06F 1/3275; G06F 1/3296; G06F 13/385; G06F 13/4022; G11C 5/14
See application file for complete search history.

(56) References Cited

U.S. PATENT DOCUMENTS

| | | | |
|---|---|---|---|
| 7,159,132 B2 * | 1/2007 | Takahashi | G06F 1/266 710/300 |
| 7,237,049 B2 | 6/2007 | Kang et al. | |
| 7,374,108 B2 | 5/2008 | Toombs et al. | |
| 7,702,935 B2 | 4/2010 | Cornwell et al. | |
| 8,397,990 B2 | 3/2013 | Fujimoto | |
| 9,201,827 B2 | 12/2015 | Lydon et al. | |
| 9,367,447 B2 * | 6/2016 | Shacham | G06F 12/0246 |
| 2005/0050235 A1 * | 3/2005 | Choi | G06F 13/1694 710/5 |
| 2006/0203556 A1 * | 9/2006 | Chen | G11C 16/30 365/185.18 |
| 2007/0174642 A1 * | 7/2007 | Cornwell | G06F 1/26 713/300 |
| 2008/0222438 A1 | 9/2008 | Lin et al. | |
| 2010/0138580 A1 * | 6/2010 | Asfur | G06F 13/385 710/301 |
| 2011/0072185 A1 * | 3/2011 | Pinto | G06F 3/0607 710/315 |
| 2015/0149841 A1 | 5/2015 | Gerber | |

OTHER PUBLICATIONS

135.07: UFS 3.0 voltage (Aug. 31, 2016). (Year: 2016).*
SD Specification Part 1 Physical Layer Specification Version 5.00 (Feb. 22, 2016). (Year: 2016).*

* cited by examiner

MEMORY SYSTEM AND HOST DEVICE THAT MAINTAIN COMPATIBILITY WITH MEMORY DEVICES UNDER PREVIOUS STANDARDS AND/OR VERSIONS OF STANDARDS

CROSS-REFERENCE TO RELATED APPLICATIONS

This U.S. non-provisional patent application claims the benefit of priority under 35 U.S.C. § 119 to U.S. Provisional Patent Application No. 62/405,277, filed on Oct. 7, 2016 in the U.S. Patent and Trademark Office, and to Korean Patent Application No. 10-2016-0151620, filed on Nov. 15, 2016 in the Korean Intellectual Property Office (KIPO), the entire contents of which are incorporated by reference herein in their entireties.

BACKGROUND

1. Technical Field

The present disclosure relates to a memory system and a host device which provide a power supply scheme that is compatible with memory devices of the memory system that have different power supply requirements, including memory devices with power supply requirements under outdated standards or versions of standards.

2. Description of the Related Art

A power supply voltage for a memory device (e.g., a NAND memory device) included in a memory system (storage device of a memory system) may be determined to have a particular voltage level in accordance with a NAND standard and/or a storage standard. A host device may supply the power supply voltage having the determined voltage level to the memory device of the memory system (storage device of the memory system). To reduce power consumption, the standard may be changed or updated such that the power supply voltage of new memory devices under the updated standard are to be a lower voltage level than power supply voltage of older memory devices under the previous standard or previous version of the standard.

SUMMARY

In a case where the standard is changed, it is desirable that a new version of a host device or a memory system can support not only a new version of a memory (storage) device or other component of the memory system, but also an old version of a memory (storage) device. In other words, when a standard is updated to change (e.g., to lower) the power supply requirements, it is desirable that host devices or memory systems designed and manufactured under the new version of the standard still support memory devices (or other components) designed and manufactured under the old version of the standard.

Some example embodiments of the present disclosure provide a memory system that maintains compatibility with memory devices designed and manufactured to comply with previous standards or versions of standards for the memory system or memory devices of the memory system.

Some example embodiments of the present disclosure provide a host device that maintains compatibility with memory devices designed and manufactured to comply with previous standards or versions of standards for the memory system or memory devices of the memory system.

According to example embodiments, a memory system includes a storage device and a host device. The storage device includes a memory device, and a device controller configured to store device information. The device information includes a level of a power supply voltage required for the memory device. The host device includes a host controller and a power management integrated circuit (PMIC). The host device is configured to send a query command during a power setting period to receive the device information from the device controller. The PMIC is configured to supply a first level of power supply voltage to the memory device during the power setting period and, after the power setting period, selectively supply one of the first level of power supply voltage and a second level of power supply voltage to the memory device. The first level of power supply voltage is lower than the second level of power supply voltage.

According to example embodiments, a storage device includes a memory device and a device controller. A host device for controlling the storage device includes a host controller and a power management integrated circuit (PMIC). The host controller is configured to send a query command to the device controller during a power setting period to receive device information including a level of a power supply voltage required for the memory device. The PMIC is configured to supply a first level of power supply voltage to the memory device during the power setting period and, after the power setting period, selectively supply one of the first level of power supply voltage and a second level of power supply voltage to the memory device. The first level of power supply voltage is lower than the second level of power supply voltage.

As described above, the host device according to example embodiments may supply the power supply voltage having a low voltage level to the memory device during the power setting period. After the power setting period, the host device may continue to supply the power supply voltage having the low voltage level to the memory device, or may increase the power supply voltage to a high voltage level to supply the high voltage level to the memory device. Accordingly, the host device and the memory system according to example embodiments may prevent an unduly high power supply voltage from being supplied to the memory device while maintaining backward compatibility for the memory device that is operated by the power supply voltage having the high voltage level.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

The present disclosure relates to a memory system which provides a power supply scheme that maintains compatibility with memory devices designed and manufactured to comply with previous (e.g., older, outdated) standards or versions of standards for the memory system or memory devices. The compatibility is maintained by supporting a power supply voltage migration after a power setting period. More particularly, the present disclosure relates to a memory system that supports the migration of the power supply voltage from a lower power supply voltage to a higher power supply voltage to avoid an unduly high power supply voltage from being applied on a memory device adopted (e.g., added, used as a replacement or otherwise newly implemented for any reason) in the memory system.

A power supply voltage for a memory device, such as a NAND memory device, may be continuously scaled down to reduce power consumption. For example, technologies for reducing the power supply voltage of the NAND memory device from 3.3V to 2.5V are currently under development. JEDEC (Joint Electron Device Engineering Council) has also started to discuss the power supply voltage scaling to the 2.5V power supply voltage. Memory systems adopting the 2.5V power supply voltage, for example UFS (Universal Flash Storage) v3.0, are expected be released in the fourth quarter of 2017.

Therefore, memory systems being currently provided may need to be replaced once such incompatible NAND memory devices are produced. Alternatively, memory systems currently in stages of production planning, at least for the time being, can be designed as described herein to support an old version of the NAND memory device which adopts the 3.3V power supply voltage as well as a new version of the NAND memory device which adopts the 2.5V power supply voltage. That is, it is desirable that the memory systems are designed to have not only compatibility with new versions of the NAND memory device but to also have backward compatibility with the old version of the NAND memory device. As explained above, the difference in versions between different NAND memory devices may include differences in standards or versions of standards to which the different NAND memory devices comply.

To support the old and/or new versions of the memory devices, a technique may be considered which pre-programs that level of the power supply voltage of the memory device at the final step of fabricating the memory system. For example, manufacturers of the memory system may program a fuse array to decide which power supply voltage is supported by the memory system. Once programmed, the memory system operates at a fixed power supply voltage.

Although this fuse array programming may be a complete and clear solution for the memory system to operate at different levels of power supply voltages, it may be required to add a pad for the fuse option as well as the fuse array circuit on the memory system. Such hardware overheads unavoidably cause additional manufacturing cost and thus entail price increase of such memory systems. Further, since the memory system uses the fixed power supply voltage after the fuse array programming, the memory system cannot have backward compatibility once the fuse array is programmed to the level of the power supply voltage suitable for the new version of the memory device.

As another solution, a technique may be considered which migrates the power supply voltage after a power setting period to provide such backward compatibility. The power setting period may be a time period required to settle down the power supply voltage to operate the memory system in a stable state. The time period may be a few milliseconds.

For example, an initial level of the power supply voltage may start at a higher level of the power supply voltage, e.g. a 3.3V power supply voltage, and may maintain such power supply voltage during an entire time period of the power setting period.

During the power setting period, a host controller of the memory system may send a query command to a device controller of a storage device to request device information.

The device information may include the level of the power supply voltage at which the memory device operates. If the memory device operates at the 3.3V power supply voltage, the host controller may drive a power management integrated circuit (PMIC) to supply 3.3V continuously, or simply the host controller may not send any request to the PMIC so that the PMIC keeps providing the 3.3V power supply voltage. If the memory device operates at the 2.5V power supply voltage, the host controller may drive the PMIC to supply the 2.5V power supply voltage, and thus the 2.5V power supply voltage may be supplied to the memory device after the power setting period.

Though this technique allows for the memory system to choose the level of the power supply voltage between different levels of power supply voltage, such as 2.5V and 3.3V, it may cause electrical reliability problems on the adopted memory devices, especially when the memory device is designed to operate at the 2.5V power supply voltage. During the power setting period, an unduly high power supply voltage (i.e., the 3.3V power supply voltage) may be applied on the 2.5V-operating memory device because the (default) level of the power supply voltage applied during the power setting period is 3.3V.

The electrical damages on the memory device may bring a reliability problem during a normal operation condition after the power up condition and it may become worse with the repetition of the power-up procedure. To avoid such electrical damages on the memory device, the memory device, for example, may implement a voltage blocking logic for separating the direct voltage supply from a host to the memory device before checking and changing the appropriate voltage. This requires increasing a circuit complexity and a size in memory device.

For solving problems mentioned above, the present disclosure provides a method of migrating the power supply voltage from a lower power supply voltage to a higher power supply voltage. For example, a starting (or initial) power supply voltage may be approximately 2.5V and can be migrated to approximately 3.3V after the power setting period. A concern that the legacy 3.3V-operating memory device may not recognize a query command sent by the host controller may be relieved by limiting the power setting period to a certain amount of time period. If the query command from the host controller is not responded to during the power setting period, it may be presumed that the memory device is the legacy 3.3V-operating memory device.

According to example embodiments of the present disclosure, a memory system may choose a level of a power supply voltage applied on a memory device between a 3.3V power supply voltage and a 2.5V power supply voltage without additional hardware modification. Furthermore, the example embodiments may be immune from electrical reliability problems which may be caused from an overdriving level of the power supply voltage.

According to example embodiments of the present disclosure, a cost-effective memory system provides backward compatibility relating to power supply voltages. The backward compatibility may mean that the memory system is configured to operate using, for example, different power supply voltages for memory devices designed and manufactured to operate under both newer and older standards or versions of standards. The memory system may determine a proper power supply voltage for a memory device using firmware or other device information from the memory device, and then vary the power supply voltage to be compatible specifically with the memory device. As a result, different memory devices which operate at different power supply voltages may be selected and installed in the memory system. The memory system may not require an additional hardware cost because the memory system may decide which level of the power supply voltage will be supplied to the memory device by migrating, when necessary, the power supply voltage during the power setting period. Such a power migration according to example embodiments may be performed in a soft procedure by sending a query command to request device information without any modification of the memory system hardware, which makes the memory system cost effective.

Example embodiments of the present disclosure now will be described more fully with reference to the accompanying drawings.

Figure 1:
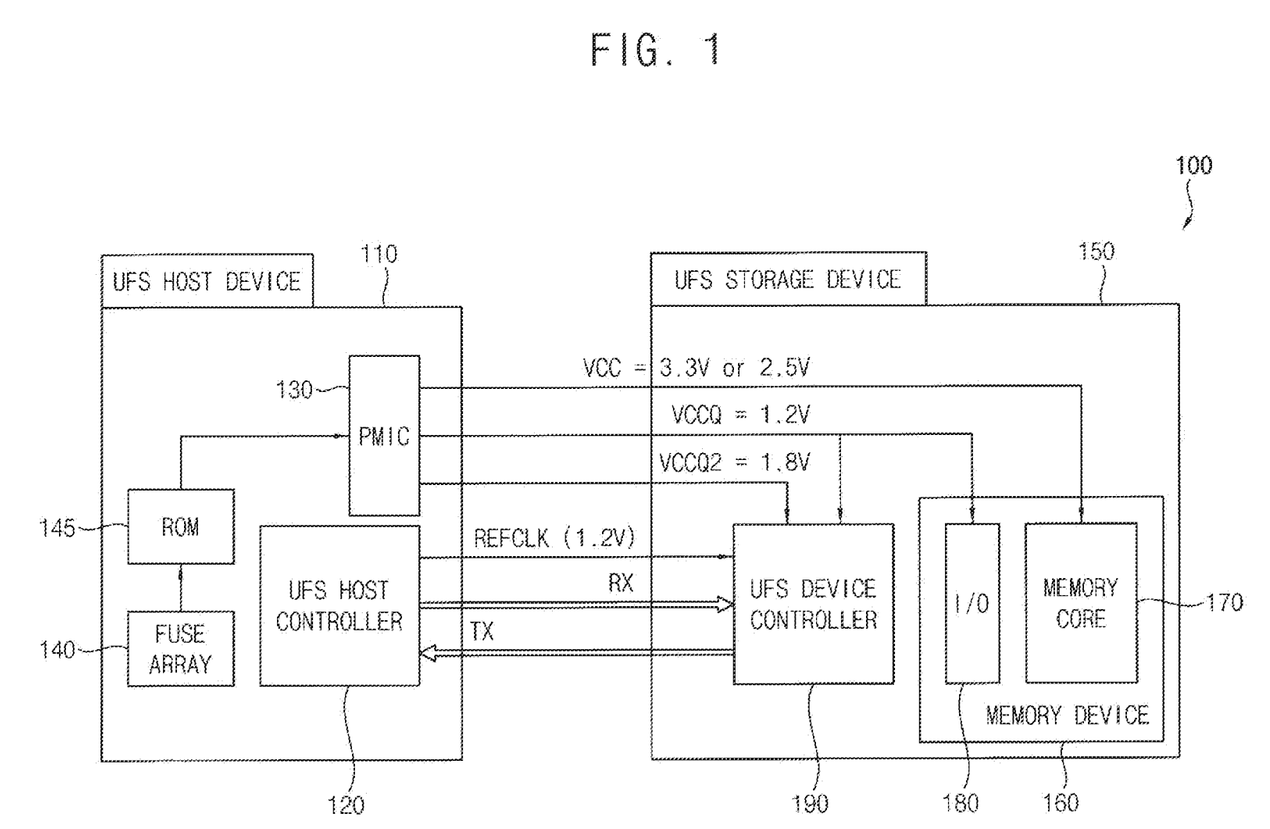
FIG. 1 is a block diagram illustrating an example of a memory system including a storage device and a host device.

FIG. 1 is a block diagram illustrating an example of a memory system including a storage device and a host device.

Referring to FIG. 1, a memory system 100 may comprise a host device 110 including a host controller 120 and a PMIC 130, and a storage device 150 including a memory device 160 and a device controller 190. The host device 110 may further include a fuse array 140 and/or a read-only-memory (ROM) to decide the level of the power supply voltage which the PMIC 130 produces.

The memory device 160 may include a memory core 170 that stores data and an input/output (I/O) circuit 180 that inputs and outputs the data. In some example embodiments, the memory device 160 may be a NAND memory device. In an example, the NAND memory device may include a three-dimensional cell array where memory cells are vertically stacked in a direction perpendicular to a substrate of the memory device. In other example embodiments, the memory device 160 can be a DRAM (Dynamic Random Access Memory) device and any new memory device such as PRAM (Phase-change Random Access Memory), FeRAM (Ferroelectric Random Access Memory) device, etc. In still other example embodiments, the memory device 160 may be any kind of a hybrid NAND, DRAM and new memory device. In still other example embodiments, the memory device 160 may be any semi-conductor chip which requires a voltage migration.

The host controller 120 may communicate with the device controller 190 by sending a request RX and receiving a response TX to control an operation of the storage device 150. Further, the host controller 120 may provide a reference clock REFCLK to the device controller 190 of the storage device 150. In some example embodiments, the reference clock REFCLK may have a voltage level of approximately 1.2V.

The PMIC 130 may produce a power supply voltage VCC and first and/or second controller power voltages VCCQ and VCCQ2. The power supply voltage VCC may be supplied to the memory core 170 of the memory device 160. For example, the power supply voltage VCC may have a voltage level of approximately 3.3V or approximately 2.5V. The first controller power voltage VCCQ may be supplied to the I/O circuit of the memory device 160 and the device controller 190. For example, the first controller power voltage VCCQ may have a voltage level of approximately 1.2V. The second controller power voltage VCCQ2 may be supplied to the device controller 190. For example, the second controller power voltage VCCQ2 may have a voltage level of approximately 1.8V. The PMIC 130 may produce one VCC of various levels of power supply voltages using the fuse array 140 and/or the ROM 145. For example, the level of power supply voltage VCC may be determined as either 3.3V or 2.5V based on programmed information on the fuse array 140. Manufacturers of the memory system 100 may decide at which power supply voltage the memory device 160 of the storage device 150 operates, and may program the fuse array 140 so that the PMIC 130 may produce the decided level of the power supply voltage VCC.

For example, if a 3.3V-operating memory device is adopted as the memory device 160, the manufacturers may program the fuse array 140 for the PMIC 130 to produce the 3.3V power supply voltage VCC. Alternatively, if a 2.5V-operating memory device is adopted as the memory device 160, then the manufacturers may program the fuse array 140 for the PMIC 130 to produce the 2.5V power supply voltage VCC.

As described above, in a case where the memory system 100 determines the level of the power supply voltage VCC using the fuse array 140, the memory system 100 may support only one of a new version of memory device (e.g., the 2.5V-operating memory device) and an old version of memory device (e.g., the 3.3V-operating memory device). That is, the memory system 100 may not have backward compatibility with the old version of memory device once the fuse array 140 is programmed to the level of the power supply voltage VCC suitable for the new version of memory device. As a result, if the memory system 100 is designed and manufactured in accordance with a new standard or version of standard that requires 2.5V, the memory system 100 will not be compatible with memory devices designed and manufactured under the old standard or version of standard that requires 3.3V.

Figure 2:
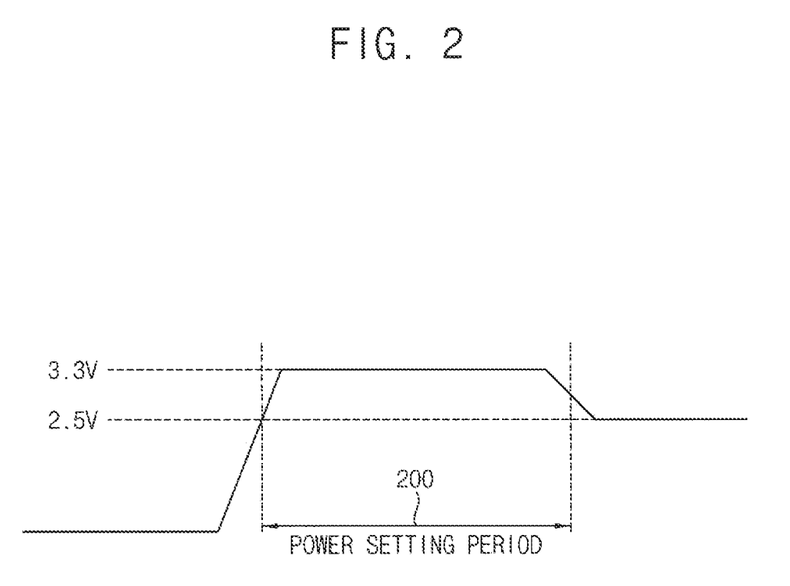
FIG. 2 is a diagram for describing an example of a power supply voltage migration in a memory system.

FIG. 2 is a diagram for describing an example of a power supply voltage migration in a memory system.

A memory system performing the power supply voltage migration illustrated in FIG. 2 may have the same or similar structure with a memory system 100 illustrated in FIG. 1, except that the supplied voltage is not fixed. The memory system performing the power supply voltage migration illustrated in FIG. 2 may send a query command to a device controller to request device information relating to the level of the power supply voltage at which the memory device operates during a power setting period 200.

Upon starting a power-up procedure, the device controller may set up a data link between the device controller and the memory device, may read out device information relating to the level of the power supply voltage, and may store the device information in a buffer (or a register) of the device controller. On receiving the query command from the host controller, the device controller may respond to the query command by sending the device information stored in the buffer to the host controller.

By analyzing and detecting which level of power supply voltage the memory device operates, the host controller may send a power selection signal to the PMIC so that the PMIC produces either the 3.3V power supply voltage or the 2.5V power supply voltage based on the power selection signal after the power setting period 200.

The memory system performing the power supply voltage migration illustrated in FIG. 2 may support not only the new version of the 2.5V-operating memory device, but also the old version of the 3.3V-operating memory device. That is, the memory system performing the power supply voltage migration may provide or have backward compatibility. However, the power supply voltage migration illustrated in FIG. 2 may bring electrical reliability problems on the memory device. That is, if the new 2.5V-operating memory device is adopted on the memory system, the memory device may be damaged while operating at the default, initial 3.3V power supply voltage for the power setting period 200. To avoid such a problem caused by unduly excessive power supply voltage (i.e., the 3.3V power supply voltage), the memory device may require an additional power protection circuit at additional hardware on the memory device which may be a factor limiting backward compatibility.

Figure 3:
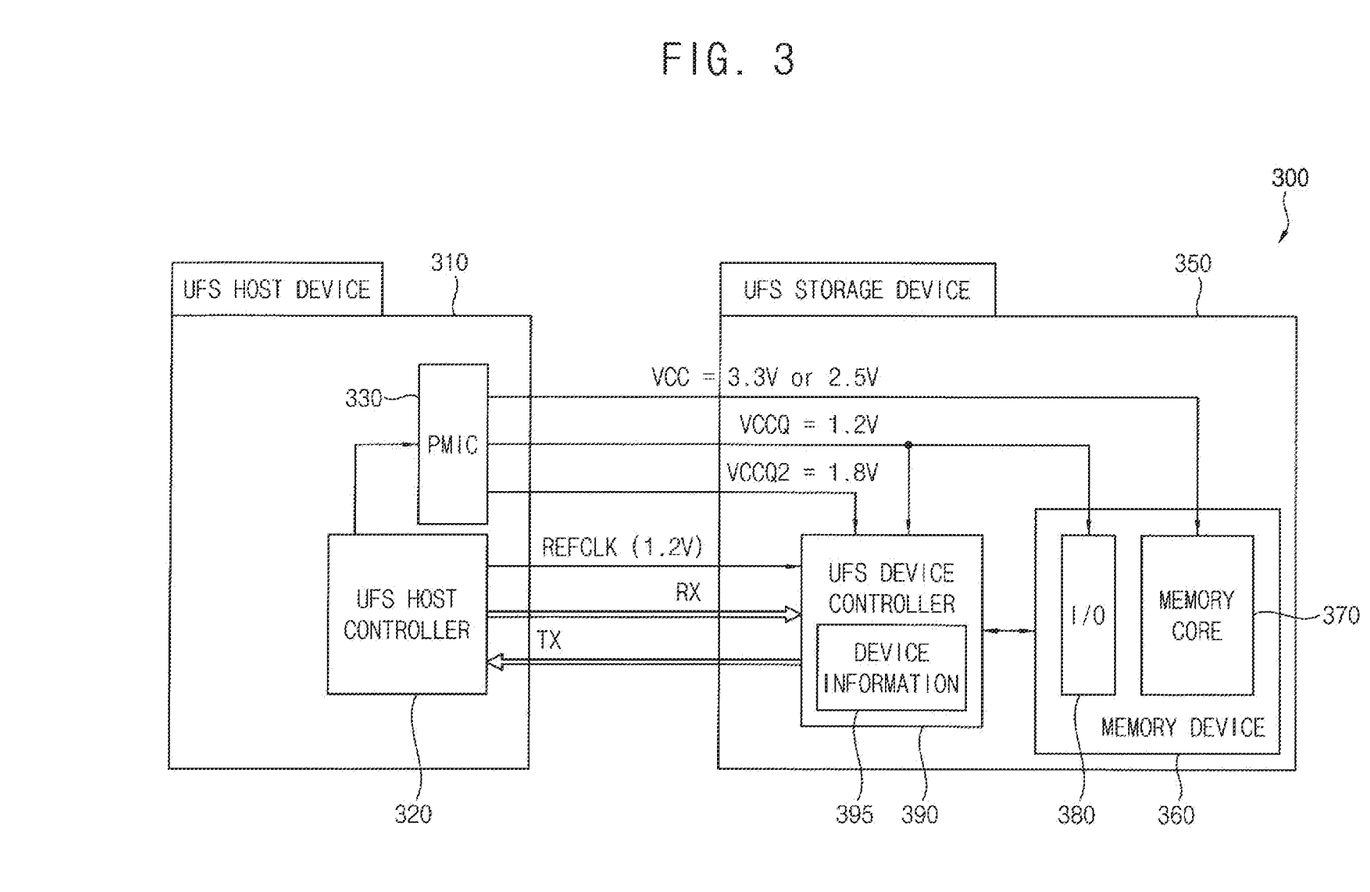
FIG. 3 is a block diagram illustrating a memory system according to example embodiments.
Figure 4:
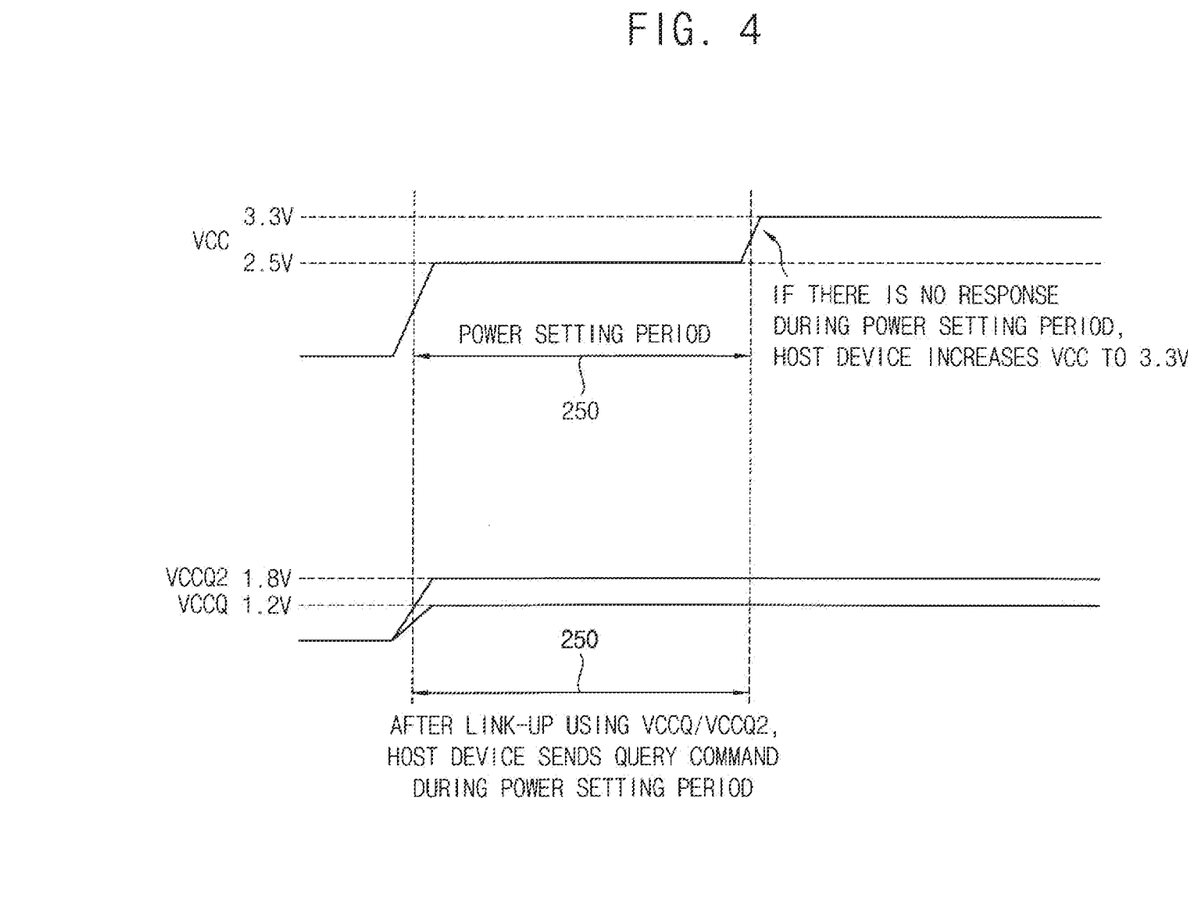
FIG. 4 is a diagram for describing an example of the power supply voltage migration in a memory system of FIG. 3 according to the example embodiments.

FIG. 3 is a block diagram illustrating a memory system according to example embodiments, and FIG. 4 is a diagram for describing an example of the power supply voltage migration in a memory system of FIG. 3 according to the example embodiments.

Referring to FIG. 3 and FIG. 4, a memory system 300 according to example embodiments may include a host device 310 and a storage device 350. In some example embodiments, as illustrated in FIG. 3, the host device 310 may be a universal flash storage (UFS) host device, and the storage device 350 may be a UFS device.

The host device 310 may include a host controller (e.g., a UFS host controller) 320 for controlling the storage device 350, and a PMIC 330 for supplying the storage device 350 with a power supply voltage VCC and controller power voltages VCCQ and VCCQ2. The host controller 320 may be linked up with a device controller (e.g., a UFS device controller) 390 of the storage device 350 through a data channel RX and TX, and may provide a reference clock REFCLK to the device controller 390.

The PMIC 330 may supply the power supply voltage VCC to a memory core 370 of a memory device 360. Here, the power supply voltage VCC may be a voltage supplied to the memory core 370 of the memory device 360. For example, the power supply voltage VCC may be a voltage supplied to a NAND flash core included in a NAND memory cell array. Further, the PMIC 330 may selectively provide, as the power supply voltage VCC, one of a first level of power supply voltage and a second level of power supply voltage. The first level of power supply voltage may be lower than the second level of power supply voltage. For example, the first level of power supply voltage may be approximately 2.5V and the second level of power supply voltage may be approximately 3.3V. The first level of power supply voltage may be applied to the memory device 360 (or the memory core 370) during a power setting period 250, and after the power setting period 250, the second level of power supply voltage may be selectively applied to the memory device 360 (or the memory core 370).

In FIG. 4, the power setting period 250 is shown between two vertical lines of broken segments. The power supply VCC starts from a default inactive level such as zero (0), and during power up initially rises to 2.5V as a default power-up level. The power supply VCC rises to 3.3V at the end of the power setting period 250, such as when no response is received by the host device 310 to the query command sent to the storage device 350 during the power setting period. The power supply VCC can also rise to 3.3V faster when, for example, a response to the query command indicates that the memory device 360 is a legacy device that operates under the higher power supply VCC.

Also in FIG. 4, the two controller power voltages VCCQ and VCCQ2 are shown rising from default inactive levels such as zero (0) at the start of the power setting period 250. For example, the PMIC 330 may supply the controller power voltage VCCQ to an I/O circuit 380 of the memory device 360 and to the device controller 390. The PMIC 330 may supply the controller power voltage VCCQ2 to just the device controller 390. The controller power voltages VCCQ and VCCQ2 may include, depending on system applications, a first controller power voltage VCCQ of approximately 1.2V and a second controller power voltage VCCQ2 of approximately 1.8V. In some example embodiments, the controller power voltages VCCQ and VCCQ2 supplied to the device controller 390 (and the I/O circuit 380) may have a fixed voltage level, and the voltage level of the controller power voltages VCCQ and VCCQ2 may not be changed during the power setting period 250 and after the power setting period 250.

When a power-up procedure for the memory system 300 or the storage device 350 is initiated, the PMIC 330 may supply the controller power voltages VCCQ and VCCQ2 to the device controller 390, and the host controller 320 and the device controller 390 may be linked up with each other based on the controller power voltages VCCQ and VCCQ2. Further, the PMIC 330 may supply the first level of power supply voltage VCC (e.g., the power supply voltage VCC of approximately 2.5V) to the memory device 360 (or the memory core 370) during the power setting period 250. If the controller power voltages VCCQ and VCCQ2 are supplied to the device controller 390, and the first level of power supply voltage VCC is supplied to the memory device 360, firmware for operating the device controller 390 may be loaded from the memory device 360 to the device controller 390. Further, in some example embodiments, device information 395 may be further loaded from the memory device 360 to a buffer (or a register) of the device controller 390, and the device information 395 may include a level of the power supply voltage VCC required for the memory device 360. In other example embodiments, the device information 395 may be loaded from a nonvolatile memory other than the memory device 360 to the buffer or the register of the device controller 390. In still other embodiments, the firmware may include the device information 395.

During the power setting period 250 after the data channel between the host controller 320 and the device controller 390 is linked up, the host controller 320 may send a query command to the device controller 390 to request the device information 395 including the level of the power supply voltage VCC at which the memory device 360 operates. If the device controller 390 recognizes the query command (e.g., if the memory device 360 is operable with the first level of power supply voltage VCC supplied during the power setting period 250, and thus the firmware and the device information 395 have been loaded to the device controller 390), the device controller 390 may provide the device information 395 to the host controller 320 in response to the query command. If the device controller 390 does not recognize the query command (e.g., if the memory device 360 requires the second level of power supply voltage VCC higher that the first level of power supply voltage VCC supplied during the power setting period 250, and thus the firmware and the device information 395 cannot be or does not otherwise need to be loaded to the device controller 390), the device controller 390 may not be able to respond to the query command. In some example embodiments, if the device controller 390 does not respond to the query command, the host controller 320 may repeatedly transfer the query command to the device controller 390 during the power setting period 250. In some example embodiments, the power setting period 250 may be set as a time-out period, for example a time-out period of a few milliseconds. Thus, the power setting period 250 may be terminated when the device information 395 is received from the device controller 390, or when the set time-out period expires.

For example, if the device controller 390 recognizes the query command, the device controller 390 may transfer, as a response, the device information 395 to the host controller 320 to notify the level of the power supply voltage VCC (which may be either approximately 2.5V or approximately 3.3V) at which the memory device 360 operates. However, any voltage level can be used for the level of the power supply voltage VCC at which the memory device 360 operates. For example, in the future, a lower voltage than 2.5V, such as approximately 1.8V, approximately 1.2V, approximately 0.9V and so on, can be used. This method can be applied in such case, i.e., starting from approximately 0.9V to approximately 1.2V to approximately 1.8V to approximately 2.5V to approximately 3.3V, for example. The host controller 320 may selectively supply the first level of power supply voltage VCC or the second level of power supply voltage VCC to the memory device 360 based on the response of the device controller 390, or the device information 395. For example, if the response (or the device information 395) notifies that a 2.5V-operating memory device is adopted on the memory system 300, the host controller 320 may continue to drive the PMIC 330 to provide the first level of power supply voltage VCC (e.g., the 2.5V power supply voltage VCC) to the memory device 360. If the device controller 390 responds that a 3.3V-operating memory device is adopted on the memory system 300, the host controller 320 may drive the PMIC 330 to provide the second level of power supply voltage VCC (e.g., the 3.3V power supply voltage VCC).

The device information 395 may be supplied at different levels of granularity. For example, the query command from a host device 310 may ask if a memory device 360 operates under a (binary) high or low power supply voltage VCC. The query command may ask for the specific power supply voltage, such as 2.5V, 3.3V or another voltage. The query command may also ask for a specific standard, or a specific type (e.g., manufacturer, model) of memory device 360. Thus, the device information 395 may be provided in a variety of forms to indicate a power supply voltage VCC required from the PMIC 330.

Alternatively, if the device controller 390 does not recognize the query command until the end of the time-out period of the power setting period 250 (or until the power setting period 250 is terminated because the predetermined time-out period expires), the host controller 320 may not receive the response for the query command until the end of the time-out period. In some example embodiments, even if the device controller 390 recognized the query command, the device controller 390 may ignore the query command until the end of the time-out period when the memory device 360 operates at the second level of power supply voltage VCC (e.g., the 3.3V power supply voltage VCC).

If the host controller 320 does not receive any response, the host controller 320 may decide that the memory device 360 operates at the second level of power supply voltage VCC (e.g., the 3.3v power supply voltage VCC), and thus may send a control signal to the PMIC 330 to change the power supply voltage VCC from the first level (e.g., approximately 2.5V) to the second level (e.g., approximately 3.3V). Alternatively, the default when the host controller 320 does not receive a response may be the lower power supply voltage (e.g., 2.5V), such that the PMIC 330 is not instructed to change the power supply voltage VCC. The default may be set to the lower level for certain types of new electronic devices that include the host device 110 and the storage device 150 and that presume the memory device 160 operates under the newer standard with the lower power supply voltage VCC. However, even such a newer electronic device can be configured to adapt to a memory device 160 or a memory device 160 that operates under the older/previous standard, by attempting to check or confirm that the memory device 160 operates under the newer standard with the lower power supply voltage VCC. In this way, a newer electronic device can adapt to an older memory device 160, such as when the memory device 160 is used as a replacement part in the newer electronic device.

As described above, in the memory system 300 according to example embodiments, the first level of power supply voltage VCC (i.e., a low power supply voltage VCC) may be first supplied to the memory device 360 (or the memory core 370), and the first level of power supply voltage VCC may be changed to the second level of power supply voltage VCC (i.e., a high power supply voltage) only when the memory device 360 requires the second level of power supply voltage VCC (or the high power supply voltage). The host device 310 may support both of a new version of the memory device 360 operating at the low power supply voltage and an old version of the memory device 360 operating at the high power supply voltage. That is, the host device 310 may have backward compatibility while preventing an unduly high power supply voltage from being supplied to the memory device 360. Further, since the storage device 350 may be implemented without an additional voltage blocking logic for preventing an overvoltage, the storage device 350 may have a low circuit complexity and a small size. Further, the memory device 360 according to example embodiments may not suffer any electrical problem because no over-supply voltage is applied to the memory device because the maximum power supply voltage to the 2.5V-operating memory device is limited to approximately 2.5V.

As described above, a host controller 320 and device controller 390 can be preconfigured to dynamically determine or confirm power supply voltage for a memory device 360. Under this configuration, host device 310 and storage device 350 are compatible with different versions of memory devices 360 that operate under different supply voltages such as 2.5V or 3.3V.

The determination of the proper voltage supply for a memory device 360 may be performed once, such as when the memory device 360 is first powered-up after being installed in a storage device 350 and the storage device 350 connected to the host device 310. Once determined from the memory device 360, the device information 395 for the memory device 360 may be retained in the device controller 390 so that the device information 395 is immediately available each time a query command for the device information 395 is received from the host controller 320. Alternatively, the full process described above may be performed each time the memory device 360 is powered-up, such that the firmware and device information 395 are provided from the I/O 380 each time.

Figure 5:
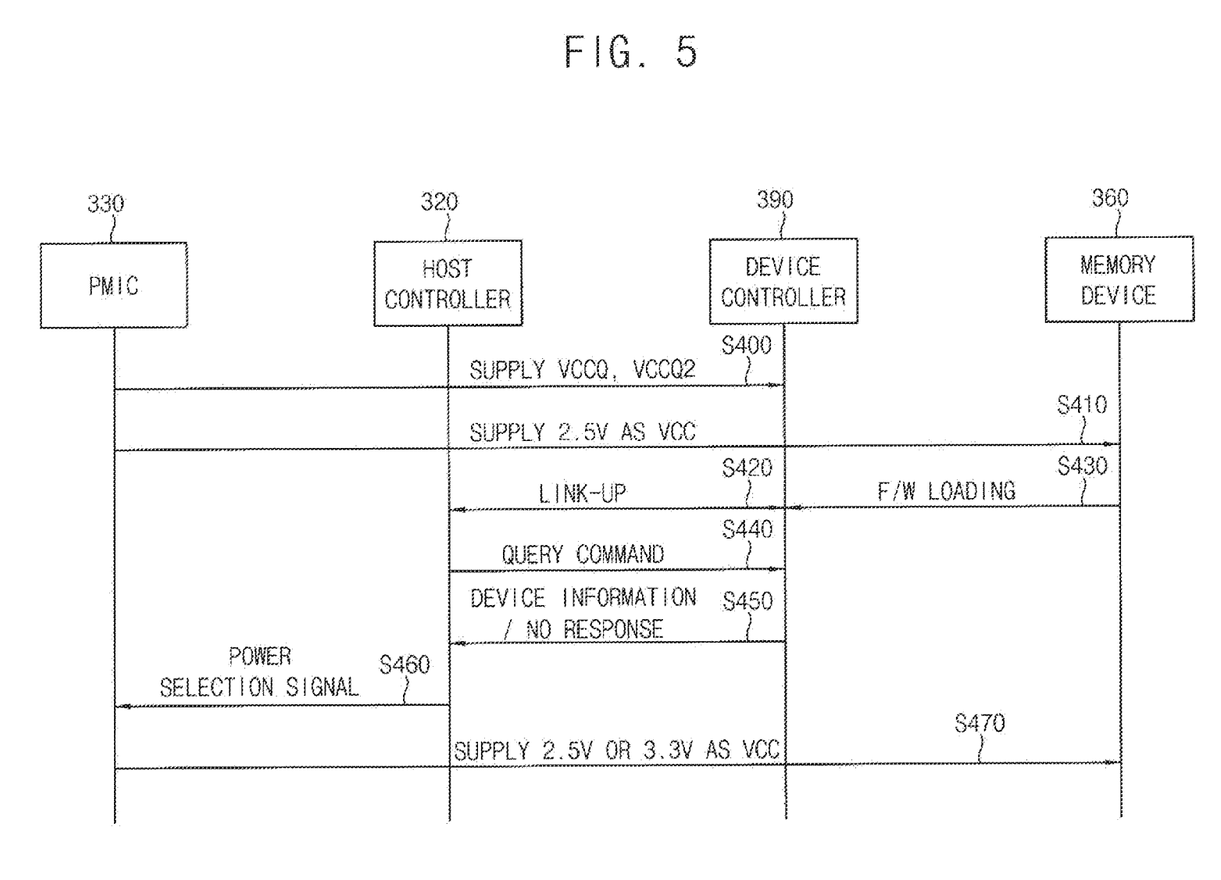
FIG. 5 is a diagram for describing signal communication between a host device and a storage device according to example embodiments.

FIG. 5 is a diagram for describing signal communication between a host device and a storage device according to example embodiments.

Referring to FIG. 3 and FIG. 5, the memory system 300 may perform a power-up procedure described below.

The PMIC 330 may supply the controller power voltages VCCQ and VCCQ2 to the device controller 390 (S400), and may supply the first level of power supply voltage VCC to the memory device 360 (S410). For example, the controller power voltages VCCQ and VCCQ2 may be approximately 1.2V and/or approximately 1.8V, and the first level of power supply voltage may be approximately 2.5V. In some example embodiments, the controller power voltages VCCQ and VCCQ2 may be set up to a predetermined voltage level (e.g., approximately 1.2V and/or approximately 1.8V) before the host controller 320 transfers the query command to receive the device information 395.

Once the controller power voltages VCCQ and VCCQ2 are supplied to the device controller 390, and the first level of power supply voltage VCC is supplied to the memory device 360, a data channel (or link-up) may be formed between the host controller 320 and the device controller 390 (S420), and firmware including the device information 395 may be loaded from the memory device 360 to the device controller 390 (S430). If the memory device 360 is designed to operate at a power supply voltage higher than the first level of power supply voltage VCC, the loading of firmware including the device information 395 from the memory device 360 to the device controller 390 may fail.

During the power setting period, the host controller 320 may send the query command to request the device information 395 of the memory device 360 (S440). The device controller 390 may provide the device information 395 to the host controller 320 in response to the query command (S450). The host controller 320 may transmit a power selection signal indicating one of the first level of power supply voltage VCC and the second level of power supply voltage VCC to the PMIC 330 (S460), and the PMIC may supply the memory device 360 with the first level of power supply voltage VCC (e.g., the 2.5V power supply voltage) or the second level of power supply voltage VCC (e.g., the 3.3V power supply voltage) in response to the power selection signal (S470).

If the device controller 390 does not recognize the query command, the host controller 320 may not receive the response from the device controller 390 (S450). In some example embodiments, if the host controller 320 does not receive the response from the device controller 390, the host controller 320 may repeatedly send the query command until the end of the timeout period of the power setting period. If the host controller 320 does not receive the device information 395 until the end of the timeout period, the host controller 320 may regard the memory device 360 as a memory device operating at the second level of power supply voltage VCC, for example the 3.3V-operating memory device. Then, the host controller 320 may generate the power selection signal indicating the second level of power supply voltage VCC to the PMIC 330 (S460), and the PMIC 330 may increase the first level of power supply voltage VCC (e.g., the 2.5V power supply voltage) to the second level of power supply voltage VCC (e.g., the 3.3V power supply voltage) to supply the memory device 360 with the second level of power supply voltage VCC (e.g., the 3.3V power supply voltage) (S470).

Figure 6:
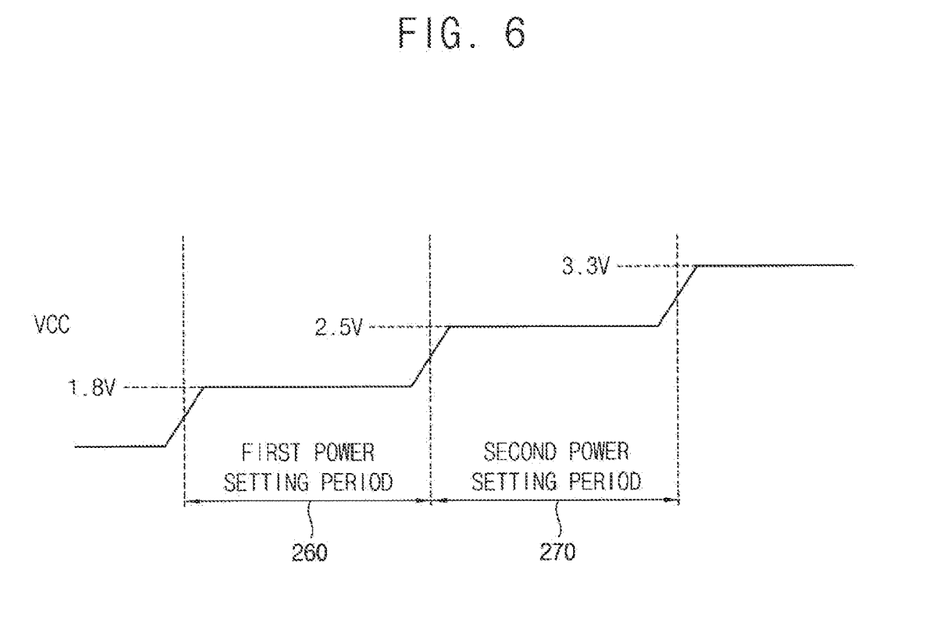
FIG. 6 is a diagram for describing an example of the power supply voltage migration in a memory system of FIG. 3 according to the example embodiments.

FIG. 6 is a diagram for describing an example of the power supply voltage migration in a memory system of FIG. 3 according to the example embodiments.

Referring to FIG. 3 and FIG. 6, the memory system 300 may have two or more power setting periods 260 and 270, and may support memory devices 360 that operate at three or more levels of power supply voltages (e.g., approximately 1.8V, approximately 2.5V and approximately 3.3V). For example, the host device 310 may supply a first level of power supply voltage VCC (e.g., approximately 1.8V) to the memory device 360 during a first power setting period. If the memory device 360 requires a power supply voltage VCC higher than the first level of power supply voltage VCC, the host device 310 may supply the memory device 360 with a second level of power supply voltage VCC (e.g., approximately 2.5V) higher than the first level of power supply voltage VCC. Further, if the memory device 360 requires a power supply voltage VCC higher than the second level of power supply voltage VCC, the host device 310 may supply the memory device 360 with a third level of power supply voltage VCC (e.g., approximately 3.3V) higher than the second level of power supply voltage VCC. As described above, the memory system 300 may step-by-step increase the power supply voltage VCC supplied to the memory device 360, thereby maintaining backward compatibility while preventing an unduly high power supply voltage from being supplied to the memory device 360 without an additional voltage blocking logic.

The inventive concepts described herein may be applied to any memory system. For example, the inventive concepts described herein may be applied to a memory system including a NAND flash memory device, a DRAM device, PRAM device, a FeRAM device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A memory system comprising:
    a storage device comprising:
        a memory device; and
        a device controller separate from the memory device and configured to store device information, wherein the device information includes a level of a power supply voltage required for the memory device; and
    a host device comprising:
        a host controller configured to send a query command to receive the device information from the device controller during a power setting period in which the memory device is supplied with a first level of power supply voltage; and
        a power management integrated circuit (PMIC) configured to increase a power supply to the memory device from an inactive level to the first level of power supply voltage during the power setting period and, after the power setting period, selectively supply one of the first level of power supply voltage and a second level of power supply voltage to the memory device,
wherein the first level of power supply voltage is lower than the second level of power supply voltage.

2. The memory system of claim 1, wherein the host device is a universal flash storage (UFS) and the host controller is a UFS host controller, and
wherein the storage device is a UFS device and the device controller is a UFS device controller.

3. The memory system of claim 1, wherein the memory device is a NAND memory device.

4. The memory system of claim 1, wherein the first level of power supply voltage and the second level of power supply voltage are 2.5V and 3.3V, respectively.

5. The memory system of claim 1, wherein, if the device controller does not respond to the query command, the host controller repeatedly sends the query command at least once more to the device controller during the power setting period.

6. The memory system of claim 1, wherein the host controller drives the PMIC to produce the second level of power supply voltage if the device controller does not respond to the query command during the power setting period.

7. The memory system of claim 1, wherein, if the device controller provides the device information in response to the query command before an end of the power setting period, the host controller drives the PMIC to produce one of the first level of power supply voltage and the second level of power supply voltage corresponding to the level of the power supply voltage indicated by the device information.

8. The memory system of claim 1, wherein the PMIC supplies a controller power voltage to the device controller.

9. The memory system of claim 8, wherein the controller power voltage is determined before the host controller sends the query command.

10. The memory system of claim 8, wherein the controller power voltage has a fixed voltage level.

11. A host device for controlling a storage device including a memory device and a device controller separate from the memory device, the host device comprising:
a host controller configured to send a query command to the device controller to receive device information, including a level of a power supply voltage required for the memory device, during a power setting period; and
a power management integrated circuit (PMIC) configured to increase a power supply to the memory device from an inactive level to a first level of power supply voltage during the power setting period and, after the power setting period, selectively supply one of the first level of power supply voltage and a second level of power supply voltage to the memory device,
wherein the first level of power supply voltage is lower than the second level of power supply voltage.

12. The host device of claim 11, wherein, if the device controller does not respond to the query command, the host controller repeatedly sends the query command at least once more to the device controller during the power setting period.

13. The host device of claim 11, wherein the host controller drives the PMIC to produce the second level of power supply voltage if the device controller does not respond to the query command during the power setting period.

14. The host device of claim 11, wherein, if the device controller provides the device information in response to the query command before an end of the power setting period, the host controller drives the PMIC to produce one of the first level of power supply voltage and the second level of power supply voltage corresponding to the level of the power supply voltage indicated by the device information.

15. The host device of claim 11, wherein the PMIC supplies a controller power voltage to the device controller, and
wherein the controller power voltage has a fixed voltage level.

16. A storage device, comprising:
a memory device, and
a device controller separate from the memory device and configured to store device information that includes a level of a power supply voltage required for the memory device,
wherein, when the device controller receives a query for the device information from a host device physically separate from the storage device during a power setting period in which the memory device is supplied with a first level of power supply voltage increased from an inactive level, the device controller is configured to provide the device information to dynamically increase power supply from the first level of power supply being currently provided to a second level of power supply required for the memory device.

17. The storage device of claim 16,
wherein the level of power supply being currently provided is a default level of power supply for the memory device.

18. The storage device of claim 16,
wherein the level of the power supply required for the memory device is set under a standard that has since been replaced by an updated standard, and the updated standard provides for the level of power supply being currently provided.

19. The storage device of claim 16,
wherein the memory device is a NAND memory device.

20. The storage device of claim 16,
wherein the storage device receives at least one fixed controller power voltage, separate from the power supply voltage, from the host device prior to receiving the query.

* * * * *